United States Patent
Nanao

(10) Patent No.: US 10,042,261 B2
(45) Date of Patent: Aug. 7, 2018

(54) METHOD OF APERTURE ALIGNMENT AND MULTI CHARGED PARTICLE BEAM WRITING APPARATUS

(71) Applicant: NUFLARE TECHNOLOGY, INC., Yokohama-shi (JP)

(72) Inventor: Tsubasa Nanao, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 98 days.

(21) Appl. No.: 15/341,297

(22) Filed: Nov. 2, 2016

(65) Prior Publication Data

US 2017/0146910 A1    May 25, 2017

(30) Foreign Application Priority Data

Nov. 25, 2015    (JP) ................. 2015-229833

(51) Int. Cl.
   *G03F 7/20*      (2006.01)
   *H01J 37/30*     (2006.01)
   *H01J 37/304*    (2006.01)
   *H01J 37/317*    (2006.01)

(52) U.S. Cl.
   CPC .......... *G03F 7/2059* (2013.01); *H01J 37/304* (2013.01); *H01J 37/3177* (2013.01)

(58) Field of Classification Search
   CPC .... G03F 7/2059; H01J 37/304; H01J 37/3177
   USPC .......................................... 430/30, 296, 942
   See application file for complete search history.

(56) References Cited

FOREIGN PATENT DOCUMENTS

| JP | 9-162096 | 6/1997 |
|---|---|---|
| JP | 2000-30647 | 1/2000 |
| JP | 2006-140267 | 6/2006 |
| JP | 2008-53002 | 3/2008 |
| JP | 2009-111405 | 5/2009 |
| JP | 2013-197467 A | 9/2013 |
| JP | 2015-35489 A | 2/2015 |
| KR | 10-2014-0093638 A | 7/2014 |

OTHER PUBLICATIONS

Office Action dated Aug. 16, 2017 in Korean Patent Application No. 10-2016-0154114.

*Primary Examiner* — Christopher G Young
(74) *Attorney, Agent, or Firm* — Oblon, McClelland, Maier & Neustadt, L.L.P.

(57) ABSTRACT

In one embodiment, a method of aperture alignment for a multi charged particle beam writing apparatus includes irradiating a shaping aperture member with a charged particle beam while changing an incident direction, detecting a current for each of the incident directions of the charged particle beam, producing a current distribution map based on the incident direction and the current, and moving the shaping aperture member or a blanking aperture member based on the current distribution map to align the shaping aperture member with the blanking aperture member.

13 Claims, 7 Drawing Sheets

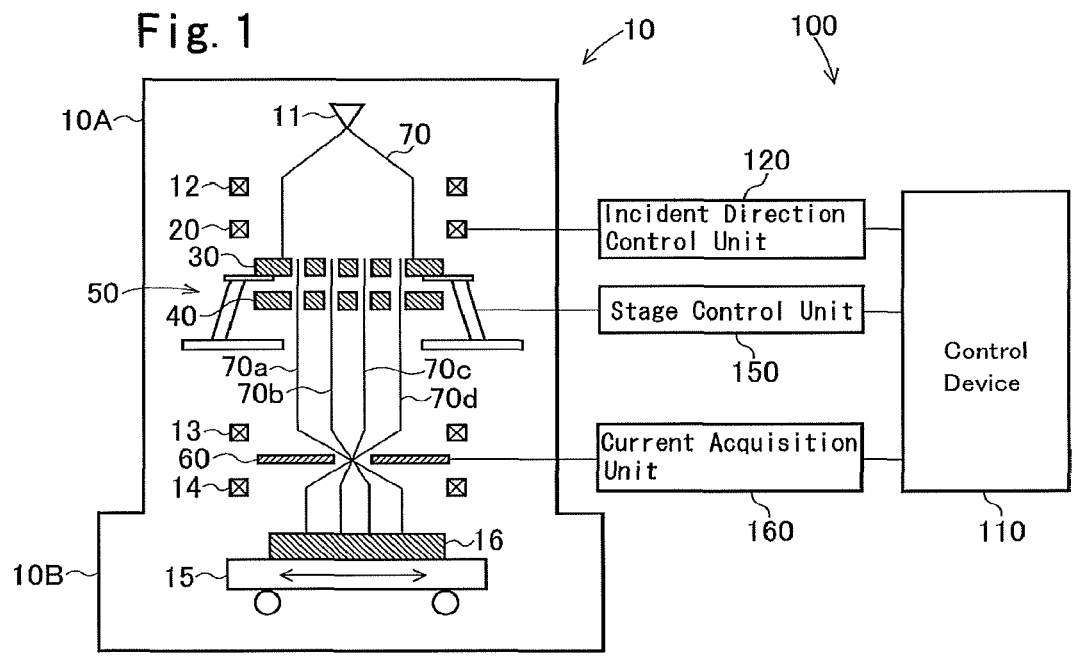
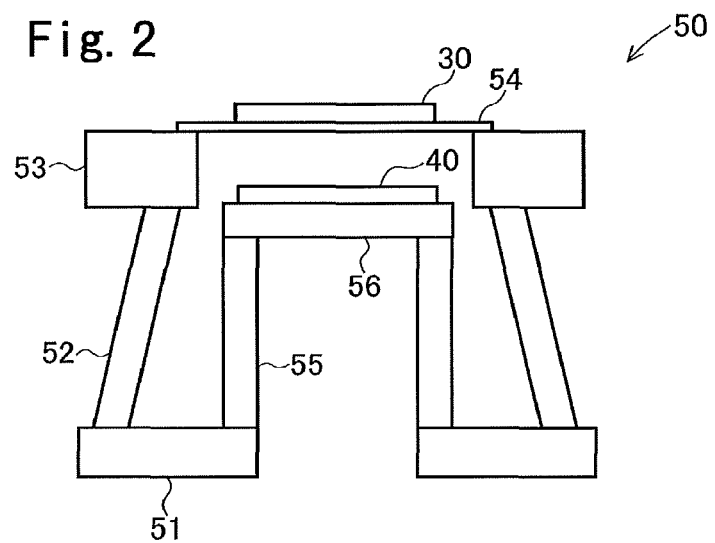

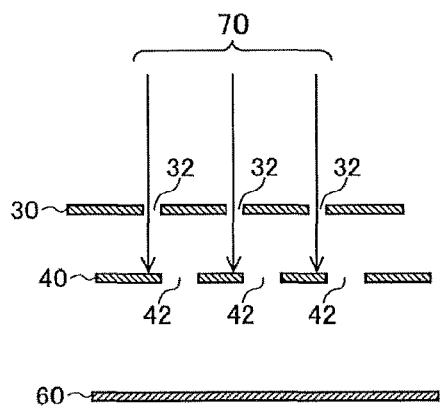
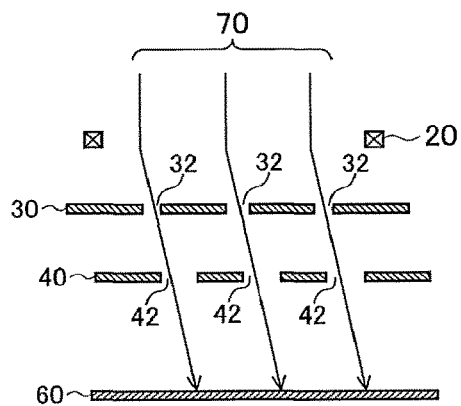
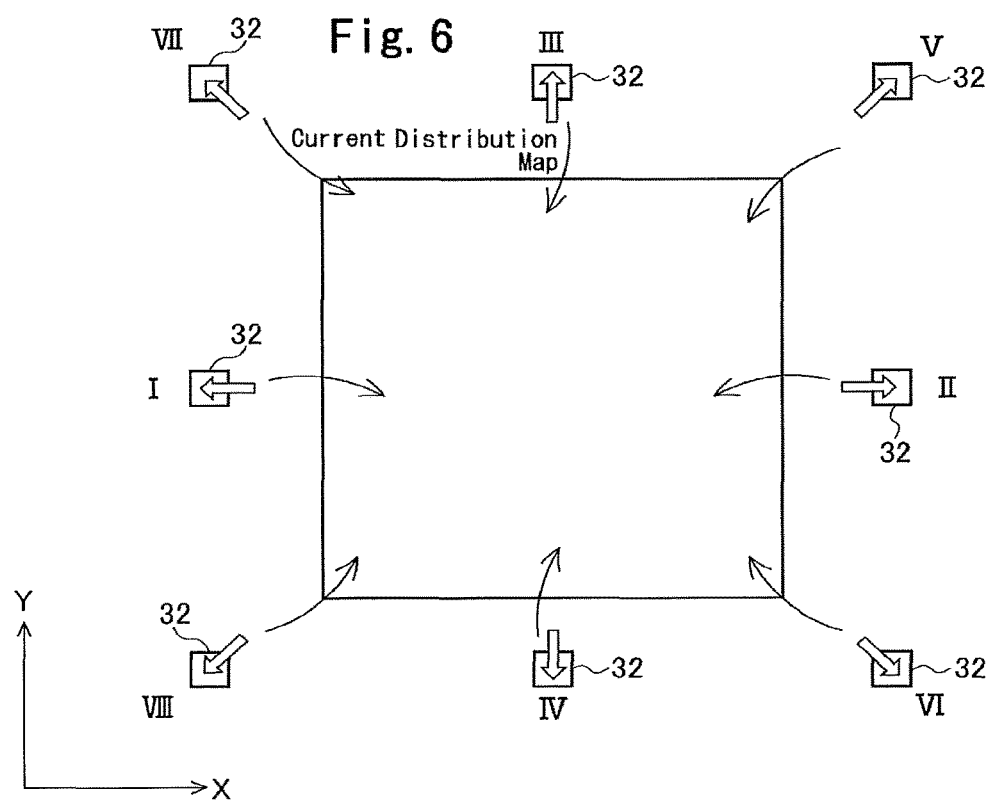

METHOD OF APERTURE ALIGNMENT AND MULTI CHARGED PARTICLE BEAM WRITING APPARATUS

CROSS REFERENCE TO RELATED APPLICATION

This application is based upon and claims benefit of priority from the Japanese Patent Application No. 2015-229833, filed on Nov. 25, 2015, the entire contents of which are incorporated herein by reference.

FIELD

The present invention relates to a method of aperture alignment and a multi charged particle beam writing apparatus.

BACKGROUND

As LSI circuits are increasing in density, circuit linewidths required of semiconductor devices are becoming finer year by year. To form a desired circuit pattern on a semiconductor device, a method is used which includes reducing the size of a high-accuracy original pattern (mask or also called a reticle, which is used particularly in a stepper or a scanner) formed on quartz and transferring the reduced pattern to a wafer with a reduced projection exposure apparatus. The high-accuracy original pattern is written through an electron beam writing apparatus by using what is called electron beam lithography technology.

A writing apparatus using multiple beams enables irradiation with many beams at once as compared with writing with a single electron beam, and thus markedly increases throughput. In such a multi-beam writing apparatus, for example, an electron beam emitted from an electron gun passes through a shaping aperture member having a plurality of holes, thus forming multiple beams (electron beams). Under the shaping aperture member, a blanking aperture member is disposed. The blanking aperture member has passage holes aligned with the holes arranged in the shaping aperture member. In each of the passage holes, a blanker is disposed. Each blanker performs blanking deflection on the electron beam passing through the passage hole. The electron beams deflected by the blankers are interrupted. The electron beams that are not deflected by the blankers are applied to a sample.

In the multi-beam writing apparatus, these two aperture members have to be aligned with each other so that beams passed through the shaping aperture member can pass through the passage holes of the blanking aperture member.

In the related art, to allow beams to pass through holes of two aperture members, the center of each of the aperture members and the amount of rotation thereof are measured by use of a coil or a deflector disposed between the aperture members, and alignment is performed based on measurements. However, in a multi-beam writing apparatus including a shaping aperture member and a blanking aperture member arranged close to each other, it is difficult to dispose a mechanism for deflecting beams between these aperture members.

Alignment can be performed by repeatedly moving and rotating a stage holding the aperture members. Disadvantageously, such a way of repeatedly moving the stage requires much time for alignment.

BRIEF DESCRIPTION OF THE DRAWINGS

FIG. 1 is a schematic diagram of a writing apparatus according to an embodiment of the present invention;

FIG. 2 is a schematic diagram of an aperture stage;

FIG. 5A is a diagram illustrating a case where beams do not pass through the blanking aperture member and FIG. 5B is a diagram illustrating a case where deflected beams pass through the blanking aperture member;

FIG. 6 is a diagram illustrating a method of producing a current distribution map;

DETAILED DESCRIPTION

Figure 3A:
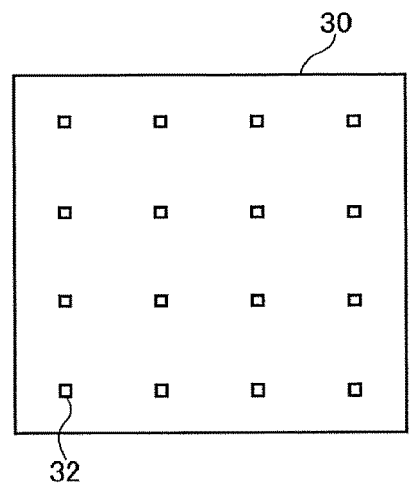
FIG. 3A is schematic diagram of a shaping aperture member and FIG. 3B is a schematic diagram of a blanking aperture member.

According to one embodiment, a method of aperture alignment is for a multi charged particle beam writing apparatus that includes an emitter emitting a charged particle beam, a shaping aperture member having a plurality of first apertures to form multiple beams when irradiated with the charged particle beam, a blanking aperture member having a plurality of second apertures corresponding to the first apertures and including a blanker disposed in each of the second apertures, the blanker performing blanking deflection on a corresponding one of the multiple beams, an incident direction controller deflecting the charged particle beam emitted from the emitter to change an incident direction in which the charged particle beam is incident on the shaping aperture member, and a detector detecting a current of the multiple beams passed through the blanking aperture member. The method includes irradiating the shaping aperture member with the charged particle beam while causing the incident direction controller to change the incident direction, causing the detector to detect a current for each of the incident directions of the charged particle beam, producing a current distribution map based on the incident direction and the current, and moving the shaping aperture member or the blanking aperture member based on the current distribution map to align the shaping aperture member with the blanking aperture member.

In an embodiment, a configuration using an electron beam as an example of a charged particle beam will be described. The charged particle beam is not limited to the electron beam. For example, an ion beam may be used.

FIG. 1 is a schematic diagram illustrating the configuration of a writing apparatus according to the embodiment of the present invention. The writing apparatus of FIG. 1 is an example of a multi charged particle beam writing apparatus.

The writing apparatus includes a writing unit 10 and a controller 100. The controller 100 includes a control device 110, an incident direction control unit 120, a stage control unit 150, and a current acquisition unit 160. The writing unit 10 includes an electron optical column 10A and a writing chamber 10B. The electron optical column 10A accommodates an electron gun 11, an illumination lens 12, a reduction lens 13, an objective lens 14, an alignment coil 20, a shaping aperture member 30, a blanking aperture member 40, an aperture stage 50, and a detector 60.

The writing chamber 10B accommodates an XY stage 15. A sample 16, such as a mask, serving as a writing target substrate when writing is performed, is placed on the XY stage 15. Examples of the sample 16 include an exposure mask used to fabricate a semiconductor device and a semiconductor substrate (silicon wafer) on which semiconductor devices are to be fabricated. In addition, examples of the sample 16 include mask blanks that are coated with resist and that have not yet been subjected to writing.

As illustrated in FIG. 3A, the shaping aperture member 30 has holes 32 (first apertures) arranged in a matrix of m columns extending in a longitudinal direction of the member×n rows extending in a lateral direction thereof (m, n≥2) at a predetermined arrangement pitch. The holes 32 are rectangular and have the same shape and dimensions. The holes 32 may be circular.

The illumination lens 12 allows an electron beam 70 emitted from the electron gun 11 (emitting unit) to be applied substantially perpendicular to the entirety of the shaping aperture member 30. The electron beam 70 is applied to an area including all of the holes 32. The electron beam 70 partly passes through the holes 32, thus forming multiple beams 70a to 70d.

Figure 3B:
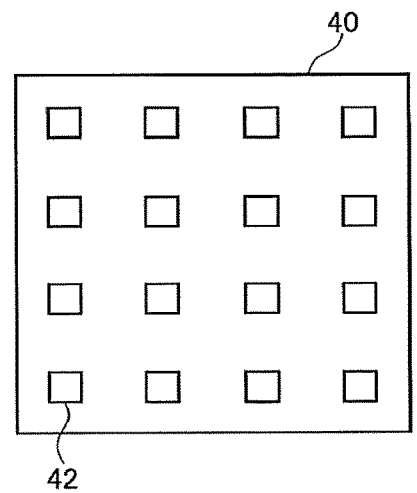

As illustrated in FIG. 3B, the blanking aperture member 40 has passage holes 42 (second apertures) aligned with the holes 32 arranged in the shaping aperture member 30. In each of the passage holes 42, two electrodes paired (a blanker, which is not illustrated) are arranged. Each of the electron beams passing through the passage holes 42 is independently deflected by a voltage applied to the two electrodes paired. As described above, each of the blankers performs blanking deflection of a corresponding one of the multiple beams passed through the holes 32 of the shaping aperture member 30.

The passage holes 42 of the blanking aperture member 40 are greater than the holes 32 of the shaping aperture member 30. This facilitates passage of the beams through the passage holes 42.

The detector 60 is an aperture member having a hole in its central part. The multiple beams 70a to 70d passed through the blanking aperture member 40 are reduced in size by the reduction lens 13 and then travel toward the central hole of the detector 60. The electron beams deflected by the blankers of the blanking aperture member 40 are deviated from the central hole of the detector 60 and are thus interrupted by the detector 60. On the other hand, the electron beams that have not been deflected by the blankers of the blanking aperture member 40 pass through the central hole of the detector 60. Such an ON/OFF state of each of the blankers achieves blanking control, thus controlling a beam ON/OFF state of the corresponding beam.

As described above, the detector 60 interrupts the beams deflected in the beam OFF state by the blankers. The beams pass through the detector 60 for a period between the time when the beams enter the beam ON state and the time when the beams are changed to the beam OFF state, thus forming a single shot of beams.

The multiple beams passed through the detector 60 are focused by the objective lens 14, thus forming a pattern image reduced with a desired reduction rate. The beams are applied at beam irradiation positions on the sample 16. Ideally, the multiple beams applied at once are arranged at a pitch obtained by multiplying the arrangement pitch of the holes 32 of the shaping aperture member 30 by the above-described desired reduction rate.

The detector 60 is capable of detecting a current of interrupted electron beams. The current acquisition unit 160 acquires data indicating the current detected by the detector 60 and transfers the data to the control device 110. To align the shaping aperture member 30 with the blanking aperture member 40, the blankers deflect beams so that the detector 60 interrupts all of the beams passed through the blanking aperture member 40 to measure a beam current.

The alignment coil 20 is disposed above the shaping aperture member 30. The alignment coil 20 generates a magnetic field, thereby adjusting an incident direction (direction and angle) in which the electron beam 70 passed through the illumination lens 12 is incident on the shaping aperture member 30. The incident direction control unit 120 receives an instruction for the incident direction of the electron beam 70 relative to the shaping aperture member 30 from the control device 110, and controls a current flowing through the alignment coil 20 so that the beam is applied in the incident direction specified by the instruction.

The aperture stage 50 holds the shaping aperture member 30 and the blanking aperture member 40 such that the aperture members are placed on the aperture stage 50. In addition, the aperture stage 50 is capable of moving and rotating the shaping aperture member 30 in an X direction and a Y direction.

As illustrated in FIG. 2, the aperture stage 50 includes a base 51, supports 52, and a driving unit 53. The supports 52 extend upwardly from outer part of the base 51. The driving unit 53 is attached to upper ends of the supports 52. The movement of the supports 52 translates or rotates the driving unit 53. The stage control unit 150 controls the behavior of the supports 52.

A base 54 is disposed on the driving unit 53. The shaping aperture member 30 is placed on the base 54. As the driving unit 53 is moved, the shaping aperture member 30 is moved or rotated in the X direction or the Y direction.

A plurality of supports 55 extend upwardly from inner part of the base 51 such that the supports 55 are closer to the inner part than the supports 52. A base 56 is attached to upper ends of the supports 55. The blanking aperture member 40 is placed on the base 56. The supports 55 are stationary. The blanking aperture member 40 on the base 56 is at a fixed position.

While the shaping aperture member 30 on the base 54 is aligned with the blanking aperture member 40 on the base 56 such that the holes 32 of the shaping aperture member 30 are positioned above the passage holes 42 of the blanking aperture member 40, the multiple beams 70a to 70d formed after passing through the holes 32 pass through the passage holes 42.

Figure 4A:
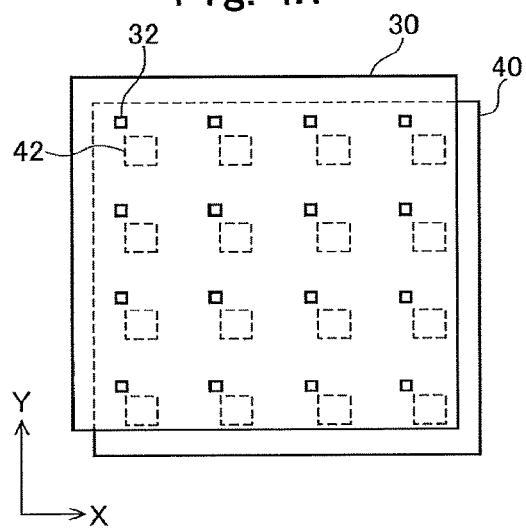
FIGS. 4A and 4B are diagrams illustrating examples of misalignment of the aperture members.
Figure 4B:
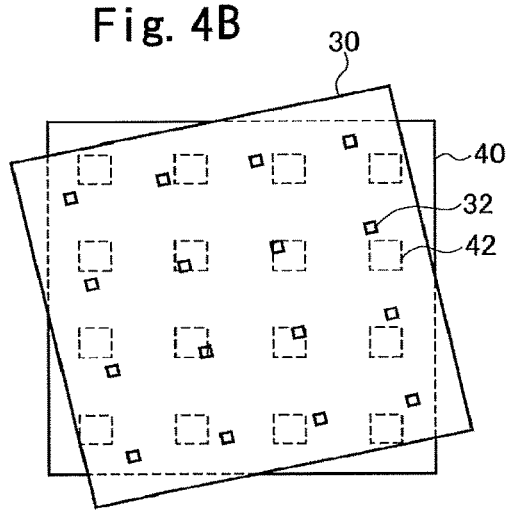

As illustrated in FIG. 4A, the shaping aperture member 30 may be misaligned relative to the blanking aperture member 40 in the X direction and the Y direction. As illustrated in FIG. 4B, the shaping aperture member 30 and the blanking aperture member 40 may be out of rotational phase. Under such misaligned conditions, as illustrated in FIG. 5A, the electron beams 70 passed through the holes 32 do not pass through the passage holes 42.

If the electron beams do not pass through the passage holes 42, the detector 60 disposed under the blanking aperture member 40 could fail to detect a beam current. It would be difficult to determine how the shaping aperture member 30 is misaligned relative to the blanking aperture member 40. Consequently, it would take much time to align the shaping aperture member 30 with the blanking aperture member 40.

According to the present embodiment, the incident direction in which the electron beam 70 is incident on the shaping aperture member 30 is changed by using the alignment coil 20. Consequently, if the shaping aperture member 30 is misaligned relative to the blanking aperture member 40, as illustrated in FIG. 5B, the beams 70 passed through the holes 32 in a certain incident direction can pass through the passage holes 42. Thus, the detector 60 can detect a beam current. In the present embodiment, how the aperture members are misaligned relative to each other is determined based on the detected current and the beam incident direction at that time.

Figure 7:
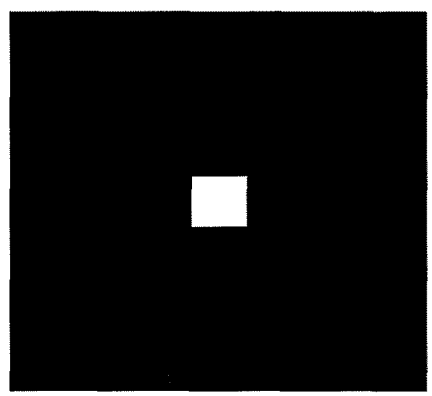
FIG. 7 is a diagram illustrating an example of a current distribution map.

The control device 110 instructs the incident direction control unit 120 to change the incident direction of the electron beam, and produces a current distribution map based on the electron beam incident direction and a current provided by the current acquisition unit 160. FIG. 6 is a diagram explaining a method of producing the current distribution map. FIG. 7 illustrates an exemplary current distribution map produced in a case where the shaping aperture member 30 is aligned with the blanking aperture member 40. The current distribution map is a brightness distribution image in which the higher the current, the higher the displayed brightness.

Referring to FIG. 6, a current obtained in an incident direction (I) in which the electron beam is deflected in a −X direction is displayed in left part of the current distribution map. A current obtained in an incident direction (II) in which the electron beam is deflected in a +X direction is displayed in right part of the current distribution map. A current obtained in an incident direction (III) in which the electron beam is deflected in a +Y direction is displayed in upper part of the current distribution map. A current obtained in an incident direction (IV) in which the electron beam is deflected in a −Y direction is displayed in lower part of the current distribution map.

A current obtained in an incident direction (V) in which the electron beam is deflected in the +X direction and the +Y direction is displayed in upper right part of the current distribution map. A current obtained in an incident direction (VI) in which the electron beam is deflected in the +X direction and the −Y direction is displayed in lower right part of the current distribution map. A current obtained in an incident direction (VII) in which the electron beam is deflected in the −X direction and the +Y direction is displayed in upper left part of the current distribution map. A current obtained in an incident direction (VIII) in which the electron beam is deflected in the −X direction and the −Y direction is displayed in lower left part of the current distribution map.

As the incident angle of the electron beam is larger, the displayed current is closer to an edge of the current distribution map. On the other hand, as the incident angle of the electron beam is smaller, the displayed current is closer to the center of the current distribution map. A current obtained at an incident angle of 0°, or in a case where the electron beam travels vertically downward is displayed at the center of the current distribution map.

Assuming that the shaping aperture member 30 is aligned with the blanking aperture member 40, as the incident angle of the electron beam decreases, that is, as the direction in which the electron beam travels is closer to the vertical direction, a detected current increases. On the other hand, as the incident angle of the electron beam increases, the beams passed through the holes 32 become less prone to passing through the passage holes 42 and a detected current decreases accordingly. For this reason, as illustrated in FIG. 7, central part of the current distribution map has high brightness and is bright (white) and part surrounding the central part has low brightness and is dark (black).

Figure 8A:
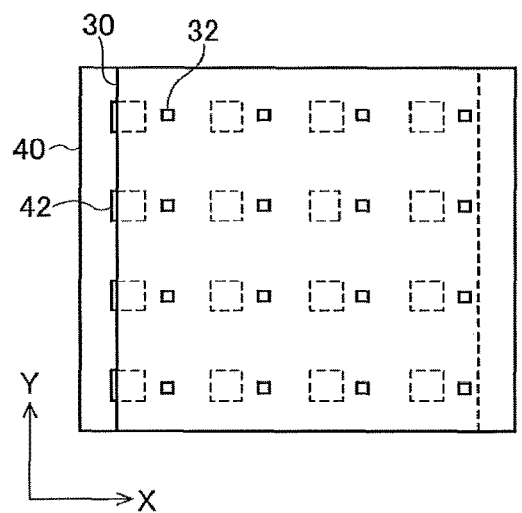
FIG. 8A is a diagram illustrating an example of misalignment of the aperture members and FIG. 8B is a diagram illustrating an example of a current distribution map.
Figure 8B:
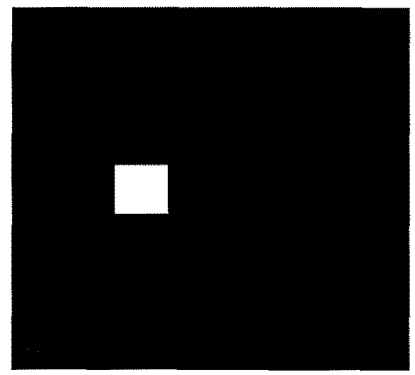

Referring to FIG. 8A, when the shaping aperture member 30 is misaligned relative to the blanking aperture member 40 in the +X direction, the electron beams formed in the incident direction for deflection in the −X direction pass through the passage holes 42 of the blanking aperture member 40. As illustrated in FIG. 8B, the current distribution map has a high-brightness area located farther in the −X direction (left part).

Figure 9A:
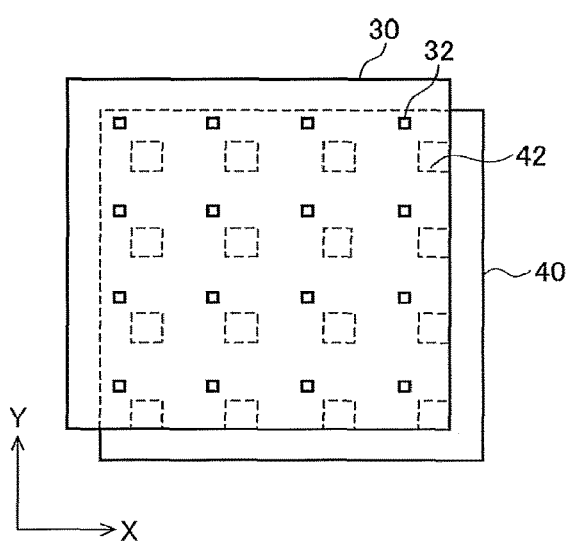
FIG. 9A is a diagram illustrating another example of misalignment of the aperture members and FIG. 9B is a diagram illustrating an example of a current distribution map.
Figure 9B:

As illustrated in FIG. 9A, when the shaping aperture member 30 is misaligned relative to the blanking aperture member 40 in the −X direction and the +Y direction, the electron beams formed in the incident direction for deflection in the +X direction and the −Y direction pass through the passage holes 42 of the blanking aperture member 40. As illustrated in FIG. 9B, the current distribution map has a high-brightness area located farther in the +X direction and the −Y direction (lower right part).

Figure 10A:
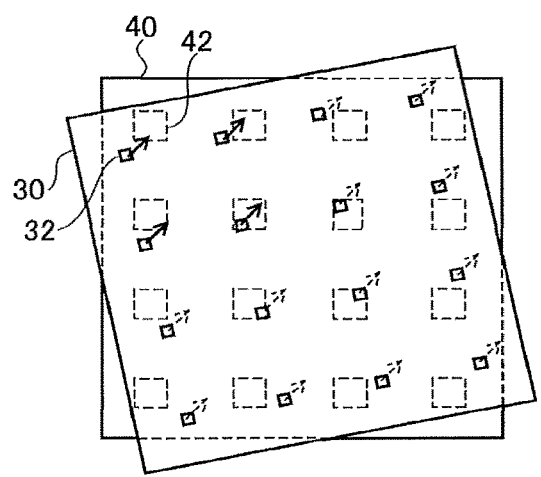
FIGS. 10A and 10B are diagrams illustrating beams that pass through the blanking aperture member and beams that do not pass through the blanking aperture member and FIG. 10C is a diagram illustrating an example of a current distribution map.
Figure 10B:
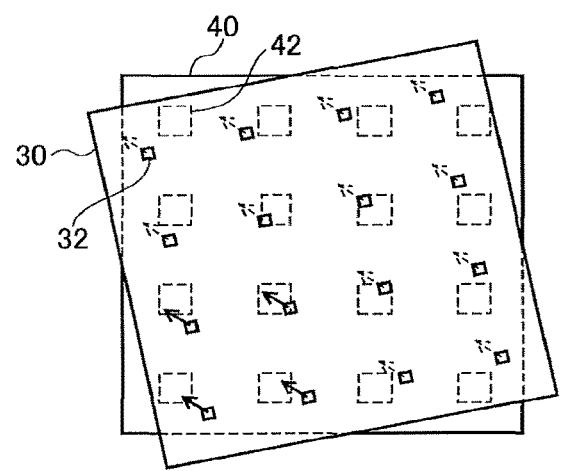

When the shaping aperture member 30 and the blanking aperture member 40 are out of rotational phase as illustrated in FIG. 4B, there is no incident direction that allows all of the beams to pass through the passage holes 42 of the blanking aperture member 40. FIGS. 10A and 10B illustrate examples of the beams passing through the passage holes 42 of the blanking aperture member 40. In FIGS. 10A and 10B, the beams that pass through the passage holes 42 are indicated by solid-line arrows and the beams that do not pass through the passage holes 42 are indicated by dashed-line arrows. Assuming that the aperture members are out of rotational phase as described above, when the incident direction is changed, an area where the beams pass through the passage holes shifts such that the number of passing beams substantially remain unchanged. The difference in current between the incident directions is small. Consequently, the whole of the current distribution map is slightly bright as illustrated in FIG. 10C.

In the present embodiment, how the two aperture members are misaligned relative to each other is determined based on the characteristics of the current distribution map and the misalignment is corrected.

Figure 11:
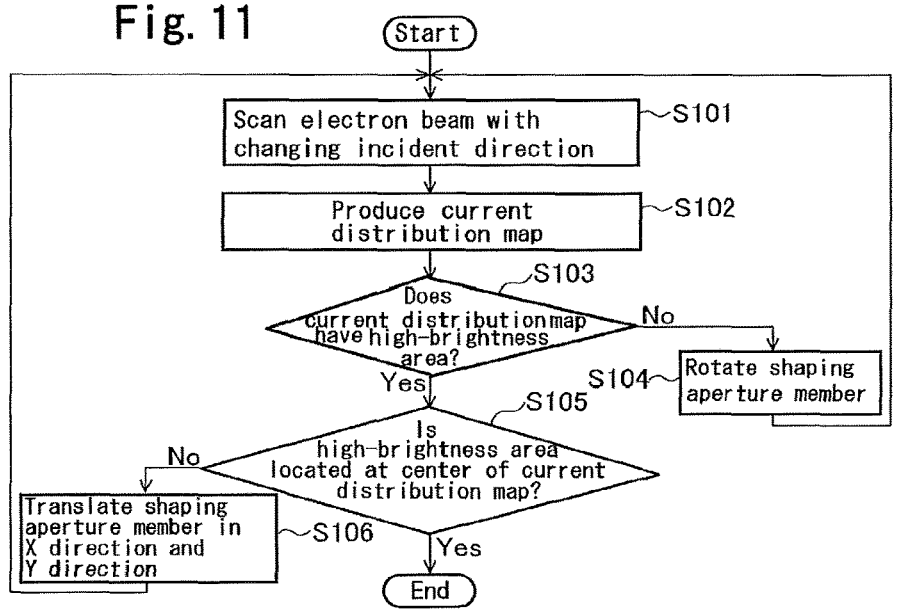
FIG. 11 is a flowchart explaining a method of aperture alignment according to the present embodiment.

A method of aperture alignment according to the present embodiment will now be described with reference to a flowchart of FIG. 11. First, current flowing through the alignment coil 20 is controlled to change the incident direction of the electron beam. The electron beam is scanned while the incident direction is changed (step S101). The detector 60 detects a beam current of electron beams passed through the blanking aperture member 40. The control device 110 produces a current distribution map based on the detected current and the electron beam incident direction (step S102).

Figure 10C:
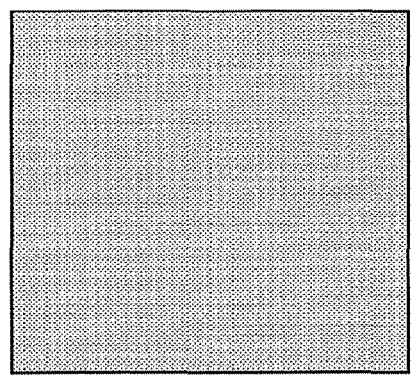

When the difference in current between the incident directions is less than or equal to a predetermined value and the current distribution map has no high-brightness area and is slightly bright as a whole as illustrated in FIG. 10C (No in step S103), the control device 110 determines that the shaping aperture member 30 and the blanking aperture member 40 are out of rotational phase and instructs the stage control unit 150 to rotate the shaping aperture member 30. The stage control unit 150 controls the behavior of the supports 52 of the aperture stage 50 to rotate the shaping aperture member 30 (step S104).

Rotating the shaping aperture member 30, scanning the beam, and producing the current distribution map are repeated until a high-brightness area appears in the current distribution map. When the shaping aperture member 30 and the blanking aperture member 40 are in rotational phase, a maximum difference in current between the incident directions is greater than or equal to the predetermined value. Consequently, a high-brightness area appears in the current distribution map.

If the current distribution map has a high-brightness area (Yes in step S103) and the high-brightness area is not located at the center of the current distribution map (No in step S105), the control device 110 detects the amount of misalignment of the shaping aperture member 30 based on the position of the high-brightness area and provides a misalignment correction amount to the stage control unit 150. The stage control unit 150 controls the behavior of the supports 52 of the aperture stage 50 so that the shaping aperture member 30 is moved by the provided misalignment correction amount (step S106).

For example, if the produced current distribution map is as illustrated in FIG. 8B, the control device 110 instructs the stage control unit 150 to translate the shaping aperture member 30 in the −X direction. The amount of movement of the shaping aperture member 30 depends on the extent to which the high-brightness area is away from the center of the current distribution map. As the high-brightness area is farther away from the center, the amount of movement increases.

If the produced current distribution map is as illustrated in FIG. 9B, the control device 110 instructs the stage control unit 150 to translate the shaping aperture member 30 in the +X direction and the −Y direction.

After the shaping aperture member 30 is moved, the control device 110 changes the electron beam incident direction and again produces a current distribution map. If the current distribution map has a high-brightness area located at the center of the map as illustrated in FIG. 7 (Yes in step S105), the control device 110 determines that the shaping aperture member 30 is aligned with the blanking aperture member 40 and then terminates the process of alignment.

According to the present embodiment, as described above, the beam is scanned while the incident direction of the electron beam 70 relative to the shaping aperture member 30 is changed by using the alignment coil 20. Consequently, if the shaping aperture member 30 is misaligned relative to the blanking aperture member 40, the beams formed in any of the incident directions pass through the passage holes 42 of the blanking aperture member 40, so that the detector 60 can detect a beam current.

A current distribution map is produced based on the electron beam incident direction and the current detected by the detector 60. The amount of misalignment of the shaping aperture member 30 is determined based on the position of a high-brightness area in the current distribution map. The stage control unit 150 moves the shaping aperture member 30 by a misalignment correction amount. Thus, the shaping aperture member 30 can be immediately aligned with the blanking aperture member 40.

In addition, if the whole of the current distribution map is slightly bright and the map has no high-brightness area, it can be determined that the shaping aperture member 30 and the blanking aperture member 40 are out of rotational phase. The shaping aperture member 30 can be rotated so that a high-brightness area (high-current area) appears in the current distribution map, thus readily allowing the shaping aperture member 30 and the blanking aperture member 40 to be in rotational phase.

Figure 12A:
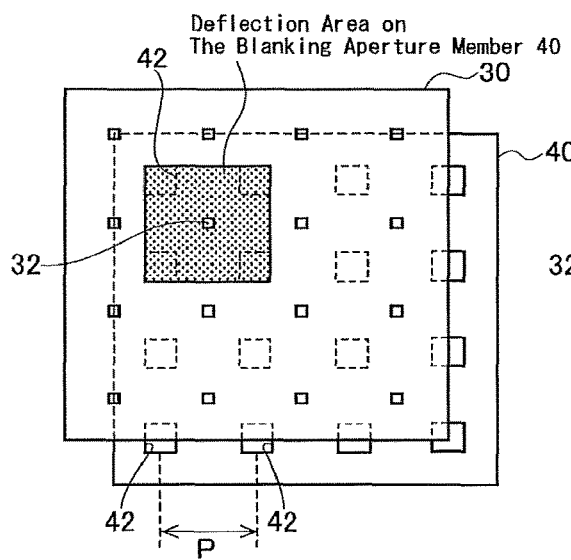
FIGS. 12A and 12B are diagrams each illustrating a beam deflection area and an aperture pitch of passage holes of the blanking aperture member.

In the above-described embodiment, a deflection amount by which the incident direction of the electron beam 70 is deflected by using the alignment coil 20 is preferably greater than or equal to an aperture pitch P of the passage holes 42 in the blanking aperture member 40, as illustrated in FIG. 12A.

Figure 12B:
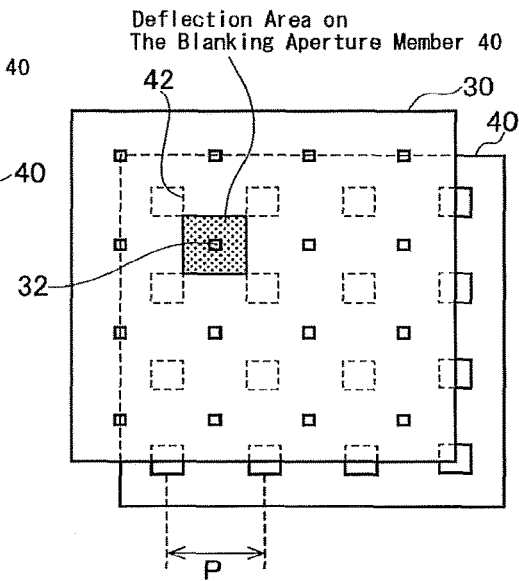

Assuming that a maximum deflection amount by which the electron beam 70 is deflected by using the alignment coil 20 is smaller than the aperture pitch P as illustrated in FIG. 12B, if the shaping aperture member 30 and the blanking aperture member 40 are in rotational phase, the beams passed through the holes 32 of the shaping aperture member 30 would not pass through the passage holes 42 of the blanking aperture member 40. The detector 60 might fail to detect a beam current.

As long as the deflection amount by which the electron beam 70 is deflected by using the alignment coil 20 is greater than or equal to the aperture pitch P, when the beam is scanned while the incident direction of the electron beam 70 is changed, beams formed in any of the incident directions can pass through the passage holes 42. The detector 60 can detect a beam current.

In the above-described embodiment, the blanking aperture member 40 is fixed and the shaping aperture member 30 is moved. The shaping aperture member 30 may be fixed and the blanking aperture member 40 may be moved (rotated). Both the shaping aperture member 30 and the blanking aperture member 40 may be moved (rotated).

In the above-described embodiment, the higher the current, the higher the brightness displayed in the current distribution map. It is only necessary to find a high-current area, or an incident direction in which many beams can pass through the passage holes 42 of the blanking aperture member 40. As the current is higher, the high-current area may be displayed with lower brightness.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of aperture alignment for a multi charged particle beam writing apparatus including
   an emitter emitting a charged particle beam,
   a shaping aperture member having a plurality of first apertures to form multiple beams when irradiated with the charged particle beam,
   a blanking aperture member having a plurality of second apertures corresponding to the first apertures and including a blanker disposed in each of the second apertures, the blanker performing blanking deflection on a corresponding one of the multiple beams, an incident direction controller deflecting the charged particle beam emitted from the emitter to change an incident direction in which the charged particle beam is incident on the shaping aperture member, and a detector detecting a current of the multiple beams passed through the blanking aperture member, the method comprising:

irradiating the shaping aperture member with the charged particle beam while causing the incident direction controller to change the incident direction;

causing the detector to detect a current for each of the incident directions of the charged particle beam;

producing a current distribution map based on the incident direction and the current; and moving the shaping aperture member or the blanking aperture member based on the current distribution map to align the shaping aperture member with the blanking aperture member.

2. The method according to claim 1, wherein the current distribution map is a brightness distribution image in which a brightness at a position based on the incident direction depends on the current, and wherein the method further includes determining an amount of movement of the shaping aperture member or the blanking aperture member based on a position of a high-current area in the current distribution map.

3. The method according to claim 2, wherein the shaping aperture member or the blanking aperture member is moved such that the high-current area is located at a center of the current distribution map.

4. The method according to claim 1, wherein the shaping aperture member or the blanking aperture member is rotated when a difference in current between the incident directions is less than or equal to a predetermined value.

5. The method according to claim 1, wherein the incident direction controller is caused to deflect the beam such that a maximum amount of beam deflection on the blanking aperture member is greater than or equal to an aperture pitch of the second apertures.

6. A multi charged particle beam writing apparatus comprising:

an emitter emitting a charged particle beam;

a shaping aperture member having a plurality of first apertures to form multiple beams when irradiated with the charged particle beam;

a blanking aperture member having a plurality of second apertures corresponding to the first apertures, the blanking aperture member including a blanker disposed in each of the second apertures, the blanker performing blanking deflection on a corresponding one of the multiple beams;

an alignment coil deflecting the charged particle beam emitted from the emitter to change an incident direction in which the charged particle beam is incident on the shaping aperture member;

a detector detecting a current of the multiple beams passed through the blanking aperture member; and a controller that irradiates the shaping aperture member with the charged particle beam while causing the alignment coil to change the incident direction, produces a current distribution map based on a current detected by the detector for each of the incident directions and the incident direction, and moves the shaping aperture member or the blanking aperture member based on the current distribution map to align the shaping aperture member with the blanking aperture member.

7. The apparatus according to claim 6, wherein the current distribution map is a brightness distribution image in which a brightness at a position based on the incident direction depends on the current, and wherein the controller determines an amount of movement of the shaping aperture member or the blanking aperture member based on a position of a high-current area in the current distribution map.

8. The apparatus according to claim 7, wherein the controller moves the shaping aperture member or the blanking aperture member such that the high-current area is located at a center of the current distribution map.

9. The apparatus according to claim 6, wherein the controller rotates the shaping aperture member or the blanking aperture member when a difference in current between the incident directions is less than or equal to a predetermined value.

10. The apparatus according to claim 6, wherein the alignment coil deflects the beam such that a maximum amount of beam deflection on the blanking aperture member is greater than or equal to an aperture pitch of the second apertures.

11. The apparatus according to claim 6, wherein the detector is an aperture member having a hole at central part of the aperture member and detects a current of the beams that are interrupted by the detector without passing through the hole.

12. The apparatus according to claim 11, wherein the controller produces the current distribution map based on a current detected by the detector interrupting all of the beams.

13. The apparatus according to claim 6, further comprising:

a first base;

a plurality of first movable supports extending upwardly from outer part of the first base;

a second base disposed above the first supports, the shaping aperture member being placed on the second base;

a plurality of second supports extending upwardly from inner part of the first base such that the second supports are closer to the inner part than the first supports; and a third base disposed on the second supports, the blanking aperture member being placed on the third base.

* * * * *